United States Patent [19]

Manteghi

[11] Patent Number: 5,863,812

[45] Date of Patent: Jan. 26, 1999

[54] PROCESS FOR MANUFACTURING A MULTI LAYER BUMPED SEMICONDUCTOR DEVICE

[75] Inventor: Kamran Manteghi, Manteca, Calif.

[73] Assignee: VLSI Technology, Inc., San Jose, Calif.

[21] Appl. No.: 715,807

[22] Filed: Sep. 19, 1996

[51] Int. Cl.⁶ .................................................. E02F 3/65
[52] U.S. Cl. ......................... 438/108; 438/118; 438/613
[58] Field of Search .................................. 438/108, 109, 438/118, 612, 613

[56] References Cited

U.S. PATENT DOCUMENTS

| | | | |
|---|---|---|---|
| 4,722,470 | 2/1988 | Johary | 437/246 |
| 5,029,325 | 7/1991 | Higgins, III et al. | 257/750 |
| 5,083,191 | 1/1992 | Ueda | 257/783 |
| 5,104,688 | 4/1992 | Ferrier et al. | 427/98 |
| 5,229,916 | 7/1993 | Frankeny et al. | 361/718 |
| 5,350,947 | 9/1994 | Takekawa et al. | 257/702 |
| 5,431,863 | 7/1995 | Mochizuki et al. | 264/25 |
| 5,477,611 | 12/1995 | Sweis et al. | 438/126 |
| 5,602,059 | 2/1997 | Horiuchi et al. | 438/15 |
| 5,602,419 | 2/1997 | Takeda et al. | 257/673 |
| 5,668,405 | 9/1997 | Yamashita | 257/668 |

*Primary Examiner*—David Graybill
*Assistant Examiner*—Alonzo Chambliss
*Attorney, Agent, or Firm*—Patrick T. King

[57] ABSTRACT

A method for fabricating a chip size package is provided. The method includes the step of forming a laminated substrate which consists of a dielectric layer and a highly conductive layer disposed thereon. Holes are drilled into the dielectric layer. A desired pattern is applied to the conductive layer. A chip structure is formed which consists of a silicon die and an insulating layer disposed thereon. Gold bumps are applied to the top surface of the bonding pads. The laminated substrate is bonded to the chip structure via the holes and gold bumps. A solder mask is applied over the top surface of the conductive layer of the laminated substrate so as to form selective solder areas. Finally, solder balls are attached to the selective solder areas.

10 Claims, 3 Drawing Sheets

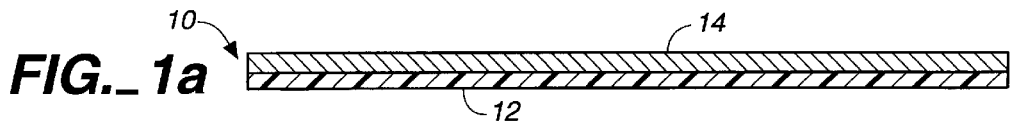
FIG._1a
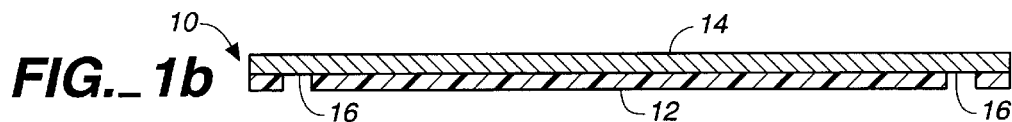
FIG._1b
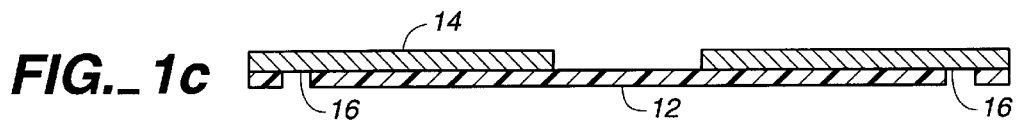
FIG._1c
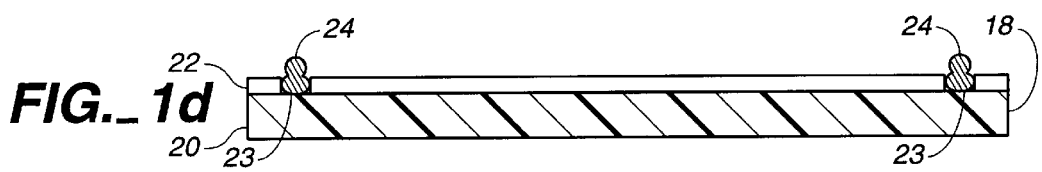
FIG._1d
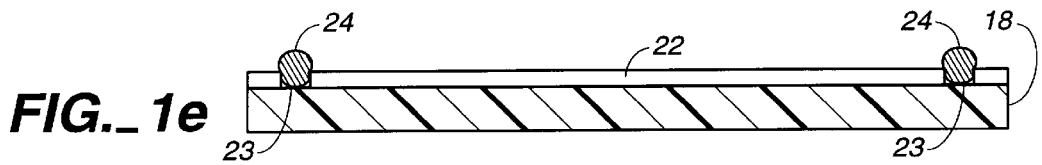
FIG._1e
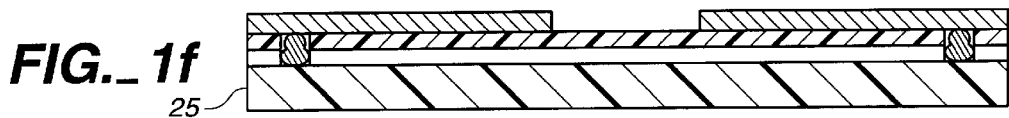
FIG._1f
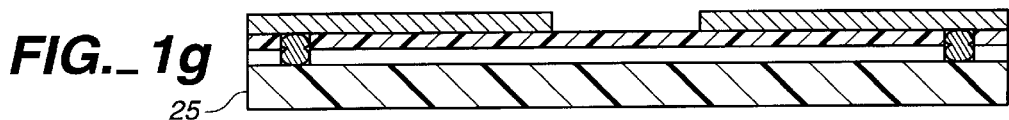
FIG._1g

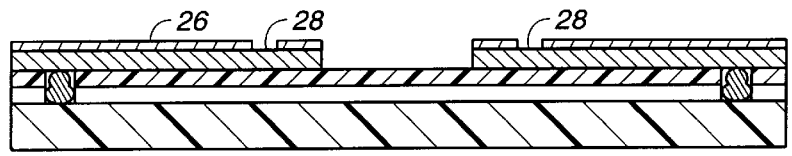
FIG._1h
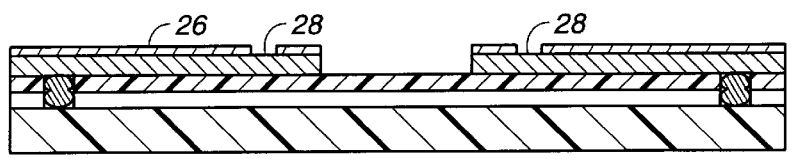
FIG._1i
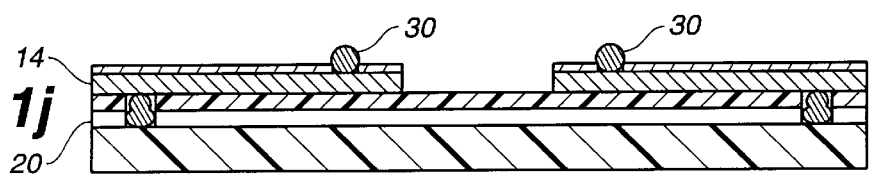
FIG._1j
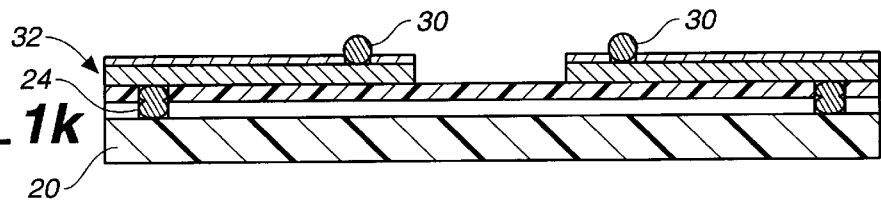
FIG._1k

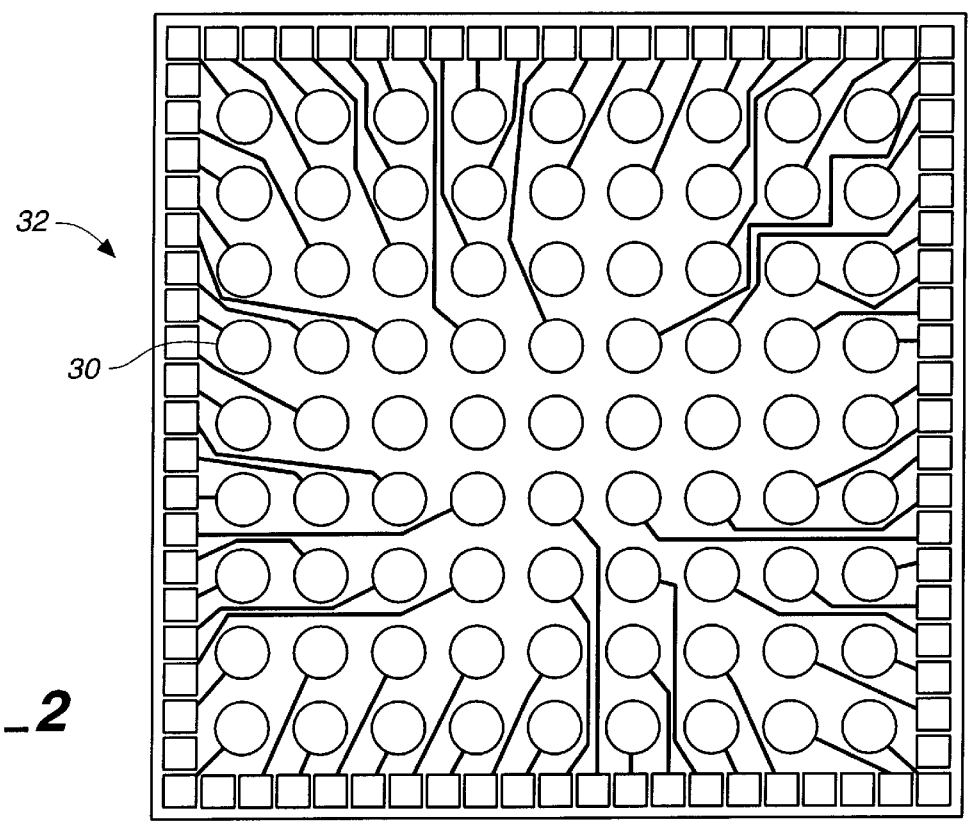
FIG._2

PROCESS FOR MANUFACTURING A MULTI LAYER BUMPED SEMICONDUCTOR DEVICE

BACKGROUND OF THE INVENTION

This invention relates generally to semiconductor integrated circuit packages and more particularly, it relates to an improved method for fabricating a chip size package which can accommodate high or low pin-count dies with a minimum amount of substrate real estate being required.

In recent years, there has been an increased interest in the packaging industry in an area generally known as a die size solution. The reason for the search for new alternatives is that the package and interconnection industry has moved away from the use of pins as connectors for electronic packaging due to the high cost of fabrication, the high failure rate in the connections, and the limitation on the density of input/output pins. Consequently, there exists a need to eliminate the classic package performance problems and to reduce the size, weight, and cost of standard packages. As a result, there has been developed new die size packaging alternatives which are classified into three main groups: (1) Bare die or Known Good Die (KGD), (2) flip chip, and (3) chip size package (CSP).

With respect to the chip size package (CSP) alternative, the package typically occupies in the range of 1 to 1.2 times the area of the chip in the package. The primary advantage of the CSP is that they can accept a die design with peripheral bond pads and route the signal to a ball on the surface to make it suitable for surface mounting. The rerouting approach on the surface of the die reduces the handling and mounting issues over the other two mentioned alternatives and facilitates in the testing processes of the product. However, the conventional versions of the CSP alternatives generally use a wire bond technique to connect the bond pads to an interposer surface for holding the solder balls, thereby introducing increased electrical resistance and conductance.

It would therefore be desirable to provide an improved method for fabricating a chip size package which is relatively simple in construction and easy to assemble. It would be also expedient to provide a chip size package which eliminates the need for TAB (tape-automated bonding) or wire bonding in order to reduce electrical resistance and conductance.

SUMMARY OF THE INVENTION

Accordingly, it is a general object of the present invention to provide an improved method for fabricating a chip size package which is relatively simple in its construction and is easy to assemble, but yet overcomes the problems of the prior art of chip size packages.

It is an object of the present invention to provide an improved method for fabricating a chip size package which can accommodate high or low pin-count dies with a minimum amount of substrate real estate being required.

It is another object of the present invention to provide an improved method for fabricating a chip size package which eliminates the need for TAB or wire bonding in order to reduce electric.

It is yet still another object of the present invention to provide an improved method for fabricating a chip size package which has enhanced electrical and thermal charaal resistance and conductance.

It is still another object of the present invention to provide a method for fabricating a chip size package which has a substrate of a simple construction, thereby reducing the number of manufacturing steps so as to increase the throughput and reduce the cycle time.

In accordance with these aims and objectives, the present invention is concerned with the provision of an improved method for fabricating a chip size package. A laminated substrate is formed which consists of a dielectric layer and a highly conductive layer disposed thereon. Holes are drilled into the dielectric layer. A desired pattern is applied to the conductive layer. A chip structure is formed which consists of a silicon die and an insulating layer disposed thereon. Gold bumps are applied to the top surface of the die bonding pad.

The laminated substrate is bonded to the chip structure via the holes and gold bumps. A solder mask is then applied over the top surface of the conductive layer of the laminated substrate so as to form selective solder areas. Finally, solder balls are attached to the selective solder areas.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1(a) through 1(k) illustrate the various steps for fabricating a chip size package in accordance with the principles of the present invention;

FIG. 2 depicts a top plan view of a chip size package produced in accordance with the teachings of the invention, as viewed from the solder ball side.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

In FIGS. 1(a) through 1(k), there are illustrated the various new and novel steps of fabricating a chip size package which can accommodate high or low pin-count dies with a minimum amount of substrate real estate being required but yet produces enhanced electrical and thermal characteristics. With particular reference to FIGS. 1(a)–1(c), there is shown a laminated substrate 10 which is comprised of a dielectric layer 12 and a highly conductive layer 14 disposed thereon. The dielectric layer 12 is preferably formed of a polyimide, polyimide/epoxy, or electrically non-conductive material. The conductive layer 14 is preferably formed of copper or similar highly conductive material. The copper layer 14 is preferably positioned on the polyimide layer 12 by known deposition techniques. One preferred technique is plating or lamination wherein the copper sheet material is laminated to the dielectric material at elevated temperatures and pressures.

After the lamination process, the next step involves placing of holes 16 through the polyimide, polyimide/epoxy, or electrically non-conductive layer 14 as shown in FIG. 1(b). The holes 16 are readily formed utilizing conventional drilling techniques, i.e., conventional mechanical or laser drilling techniques. The polyimide, polyimide/epoxy, or electrically non-conductive layer functions as an electrical insulator between the die and the circuity of the package. Thereafter, the laminated substrate 10 is patterned to the desired format for electrical connections as illustrated in FIG. 1(c). As can thus be seen, the laminated substrate is very simple in its construction. This has resulted in the reduction in the number of manufacturing steps, but yet permits increased throughput and reduces the cycle time.

The gold bumping fabrication of the semiconductor chip structure 18 is depicted in FIGS. 1(d) and 1(e). The chip structure 18 is comprised of a silicon die 20 and an insulating layer 22 formed on the upper surface thereof. The insulating layer 22 is preferably formed of a silicon dioxide (SiO$_2$)with holes formed therein for exposing bonding pads 23 on the silicon die 20. Gold (Au) bumps 24 are then applied on the bonding pads 23.

The next step of the invention involves the bonding of the laminated substrate 10 to the chip structure 18 and is illustrated in FIGS. 1(f) and 1(g). The laminated substrate of FIG. 1(c) is positioned above and at a spaced apart distance from the chip structure 18 of FIG. 1(e) so that the corresponding gold bumps 24 are aligned with the associated holes 16. Thereafter, the laminated substrate and the chip structure are both joined together, preferably with gang bonding or single point bonding tools using thermo compression or thermosonic bonding to cause the gold bumps to ball up and form the configuration of FIG. 1(f).

After the connection of the chip structure 18 to the laminated substrate 10 so as to form a subassembly 25, a solder mask 26 is applied, preferably using a screen printing or photoimaging procedure known in the art. During such procedure, the entire top surface of the subassembly 25 (patterned copper layer 14) is covered with a compatible material, except for selective solder areas 28 where it is desired to have the solder balls applied, and is subsequently cured. This step is illustrated in FIGS. 1(h) and 1(i).

Finally, the solder balls 30 are attached to the selective solder areas 28 in order to form the completed chip size package 32 shown in FIG. 2. The solder balls are finished with eutectic solder bumps, preferably 63% tin (Sn) and 37% lead (Pb) so as to reflow during a next assembly process for surface mounting the balls 30 to both the chip size package 32 and to the next-level board (i.e., motherboard). One technique suitable for use in mounting the solder balls 30 to the selective solder areas 28 is the so-called C-4 (controlled collapse chip connection) technology.

Unlike the prior art chip size packaging, the chip size package 32 of the present invention has eliminated the use of a TAB (tape-automated bonding) or wire bonding materials, thereby creating shorter electrical connections between the gold bumps 24 on the silicon die 20 and the solder balls 30 on the laminated substrate 10. As a result, the present technique for fabricating the chip size package renders smaller electrical resistance and conductance.

From the foregoing detailed description, it can thus be seen that the present invention provides an improved method for fabricating a chip size packaging which is of a relatively simple construction and is low-cost to manufacture and assemble. The novel method of the present invention includes the steps of forming a laminated substrate consisting of a dielectric layer and a highly conductive layer disposed thereon, drilling holes into the dielectric layer, and applying a desired pattern to the conductive layer. Further, a chip structure is formed consisting of a silicon die and an insulating layer disposed thereon. Gold bumps are applied to the top surface of the bonding pads. Thereafter, the laminated substrate is bonded to the chip substrate via the holes and the gold bumps. A solder mask is applied over the top surface of the conductive layer of the laminated substrate so as to form selective solder areas. Finally, solder balls are attached to the selective solder areas.

What is claimed is:

1. A method for fabricating a chip size package (32) comprising the steps of:

forming a laminated substrate (10) consisting of a dielectric layer (12) and a high conductive layer (14) disposed thereon;

drilling holes (16) into the dielectric layer (12) to expose selective solderable areas on a bottom side of said conductive layer (12);

applying a desired pattern to the conductive layer (14);

forming a chip structure (18) consisting of a silicon die (20) having bonding pads (23);

forming an insulating layer (22) disposed on the top surface of said silicon die (20), said insulating layer (22) being formed to expose the bonding pads (23) on the top surface of said silicon die (20);

applying gold bumps (24) to the bonding pads (23) on the top surface of the silicon die (20);

bonding the laminated substrate (10) to the chip structure (18) via the holes (16) exposing the selective solderable areas on the bottom side of the conductive layer (12) and using the gold bumps (24) on the top surface of the bonding pads (23) of the silicon die (20) to connect to said selective solderable areas on the bottom side of said conductive layer through said drilled holes in the dielectric layer of said laminated substrate;

applying a solder mask (26) over the top surface of the conductive layer (14) of the laminated substrate so as to form selective solder areas (28) in the top surface of the conductive layer (14) of the laminated substrate (10);

attaching solder balls (30) to the selective solder areas (28); and thereby providing a fabricated chip size package (32).

2. A method as claimed in claim 1, wherein said dielectric layer is formed of a polyimide material.

3. A method as claimed in claim 1, wherein said dielectric layer is formed of an epoxy material.

4. A method as claimed in claim 1, wherein said high conductive layer is formed of copper.

5. A method as claimed in claim 1, wherein the step of drilling holes is performed by a laser.

6. A method as claimed in claim 1, wherein said insulating layer on the top surface of said silicon die is formed of a silicon dioxide.

7. A method as claimed in claim 1, wherein said solder mask is applied by a screen printing process.

8. A method as claimed in claim 1, wherein said solder mask is applied by a photoimaging process.

9. A method as claimed in claim 1, wherein said solder balls are comprised of eutectic solder bumps.

10. A method as claimed in claim 9, wherein said solder bumps are comprised of 63% Sn and 37% Pb.

* * * * *